United States Patent [19]

Dumoulin et al.

[11] Patent Number: 4,918,386

[45] Date of Patent: Apr. 17, 1990

[54] METHOD FOR SIMULTANEOUSLY OBTAINING THREE-DIMENSIONAL NMR ANGIOGRAMS AND STATIONARY TISSUE NMR IMAGES

[75] Inventors: Charles L. Dumoulin, Ballston Lake, N.Y.; Steven P. Souza, Williamstown, Mass.; Harvey E. Cline, Schenectady, N.Y.

[73] Assignee: General Electric Company, Schenectady, N.Y.

[21] Appl. No.: 288,849

[22] Filed: Dec. 23, 1988

[51] Int. Cl.$^4$ .............................................. G01R 33/20
[52] U.S. Cl. ..................................... 324/309; 324/314
[58] Field of Search ............... 324/306, 307, 309, 312, 324/314; 128/653

[56] References Cited

U.S. PATENT DOCUMENTS

| | | | |
|---|---|---|---|
| 4,595,879 | 6/1986 | Lent et al. | 324/306 |
| 4,609,872 | 9/1986 | O'Donnell | 324/306 |
| 4,689,560 | 8/1987 | Nayler et al. | 324/306 |
| 4,714,081 | 12/1987 | Dumoulin et al. | 128/653 |

Primary Examiner—Hezron E. Williams
Assistant Examiner—Kevin D. O'Shea
Attorney, Agent, or Firm—Geoffrey H. Krauss; James C. Davis, Jr.; Marvin Snyder

[57] ABSTRACT

A method for simultaneously obtaining a three-dimensional nuclear magnetic resonance (NMR) angiographic image of moving spins associated with fluid flow in a region of a living organism sample, and a three-dimensional NMR image of stationary tissue in the same sample region, by immersing the sample in a main static magnetic field; nutating, in an excitation subsequence of each of a plurality of NMR sequences, the nuclear spins and the generating a flow-encoding magnetic field gradient selected to cause a resulting NMR response echo signal from the spin of a moving nucleus to be different from the NMR response echo signal from the spin of a substantially stationary nucleus. The acquired response data is processed to provide at least one of (1) a difference data set from which response data obtained from stationary nuclei has been substantially removed, (2) a summation data set from which response data obtained from moving nuclei has been substantially removed, and (3) a set of phase data indicating direction of flow for flow amplitudes obtained in set (1), in order to generate both an angiographic image lying in a selected plane in a three-dimensional volume, and an image of stationary tissue in the same plane.

16 Claims, 3 Drawing Sheets

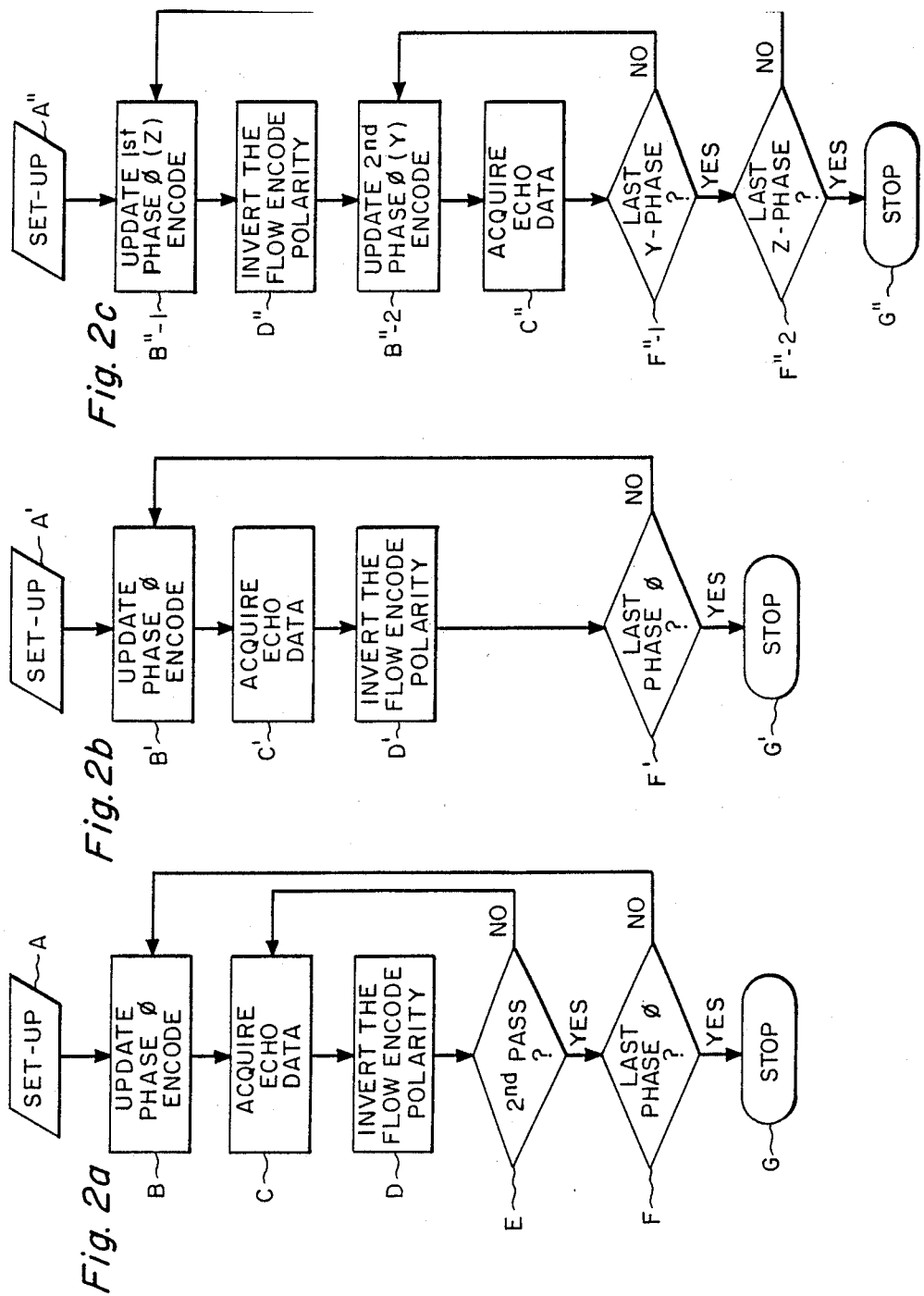

METHOD FOR SIMULTANEOUSLY OBTAINING THREE-DIMENSIONAL NMR ANGIOGRAMS AND STATIONARY TISSUE NMR IMAGES

BACKGROUND OF THE INVENTION

The present invention relates to nuclear magnetic resonance (NMR) methods for imaging flowing fluids and stationary tissue in a sample and, more particularly, to a novel NMR method in which a response, generated for each of a set of excitations of a sample, provides medically-significant images of both fluid flow and stationary tissue in the same anatomical region.

It is known to provide NMR angiographic projection images, indicating the flow of bodily fluids through various bodily passages, for medical diagnostic purposes. Methods for producing such images are described and claimed in U.S. Pat. No. 4,714,081, issued Dec. 22, 1987, assigned to the assignee of the present application and incorporated here in its entirety by reference. While those methods provide true projection images (through the entire anatomical thickness) and allow high quality NMR angiograms of arterial and venational structures to be obtained along one or more selected projection axes and with a selected direction of flow sensitivity in a sample, it is still highly desirable to obtain the same information along with information delineating stationary tissue. This is especially important in human diagnostic imaging, where there is a clear need to replace contrast injection X-ray angiographic techniques with non-invasive NMR angiography techniques. NMR techniques are at a disadvantage with respect to X-ray methods due to the inherently low signal-to-noise ratio of NMR. Fortunately, this problem can be offset by the ability to acquire data in any dimensional volume and to acquire data from both flowing fluid and stationary tissue simultaneously, to overcome the major limitations of prior NMR and X-ray techniques as to the inability of existing angiographic methods to visualize the vessel walls, plaques and material (thrombus, blood, etc.) behind wall dissections. Accordingly, a method for simultaneously obtaining three-dimensional NMR angiograms and three-dimensional images of stationary tissue, in the same anatomical region, is highly desirably.

BRIEF SUMMARY OF THE INVENTION

In accordance with the invention, a method for simultaneously obtaining a three-dimensional nuclear magnetic resonance (NMR) angiographic image of moving spins associated with fluid flow in a region of a living organism sample, and a three-dimensional NMR image of stationary tissue in the same sample region, includes the steps of: immersing the sample in a main static magnetic field; nutating, in an excitation subsequence of each of a plurality of NMR sequences, the spins of all nuclei of a selected species; after each nutation, a pair of alternating-polarity flow-encoding signal pulses are generated in a first magnetic field gradient impressed upon the sample, in a first direction selected to cause a resulting NMR response echo signal from the spin of a nucleus moving in the first direction to be different from the NMR response echo signal from the spin of a substantially stationary nucleus, with alternating ones of the sequences having each of the flow-encoding pulses with a polarity opposite to the polarity of the like-positioned flow-encoding pulse in the previous sequence; then acquiring, responsive to a readout magnetic field gradient impressed upon the sample in a second direction, independent of the first direction, a set of data from the NMR response echo signal evoked, from at least the sample portion, with each one of a multiplicity S of combinations phase-encoding amplitudes operating upon said selected sample portion in the remaining two independent directions of a three-dimensional Cartesian coordinate system; processing the data in each of the acquired NMR response signal data sets to generate at least a plurality of (1) a difference data set from which response data obtained from stationary nuclei has been substantially removed, (2) a summation data set from which response data obtained from moving nuclei has been substantially removed, and (3) a set of phase data indicating direction of flow for flow amplitudes obtained in set (1); and generating, responsive to the plurality of data sets, both an angiographic image lying in a selected plane in a three-dimensional volume, and an image of stationary tissue in the same plane.

In one presently preferred embodiment of our novel NMR method, a pair of successive sequences (NEX=2) are used, for each value set of a pair of phase-encoding gradients, while the flow-encoding gradient lobes are modulated. In other presently preferred embodiments, each sequence phase-encodes a different voxel line and thus the pair of phase-encoding gradient values are changed with each sequence (NEX=1).

Accordingly, it is an object of the present invention to provide a method for simultaneously obtaining a NMR angiographic imaging of moving fluid flowing in vessels through a desired volume of a sample, such as the anatomy of a living subject, and a NMR image of stationary tissue in the same sample volume.

This and other objects of the present invention will become apparent upon reading the following detailed description of my invention, when considered in conjunction with the drawings.

BRIEF DESCRIPTION OF THE DRAWINGS

FIGS. 2a, 2b and 2c are flow diagrams of the steps utilized respectively for a NEX=2 embodiment of the present invention; a first NEX=1 (generalized) embodiment of the present invention, and a particular NEX=1 embodiment of the present invention;

DETAILED DESCRIPTION OF THE INVENTION

Figure 1A:
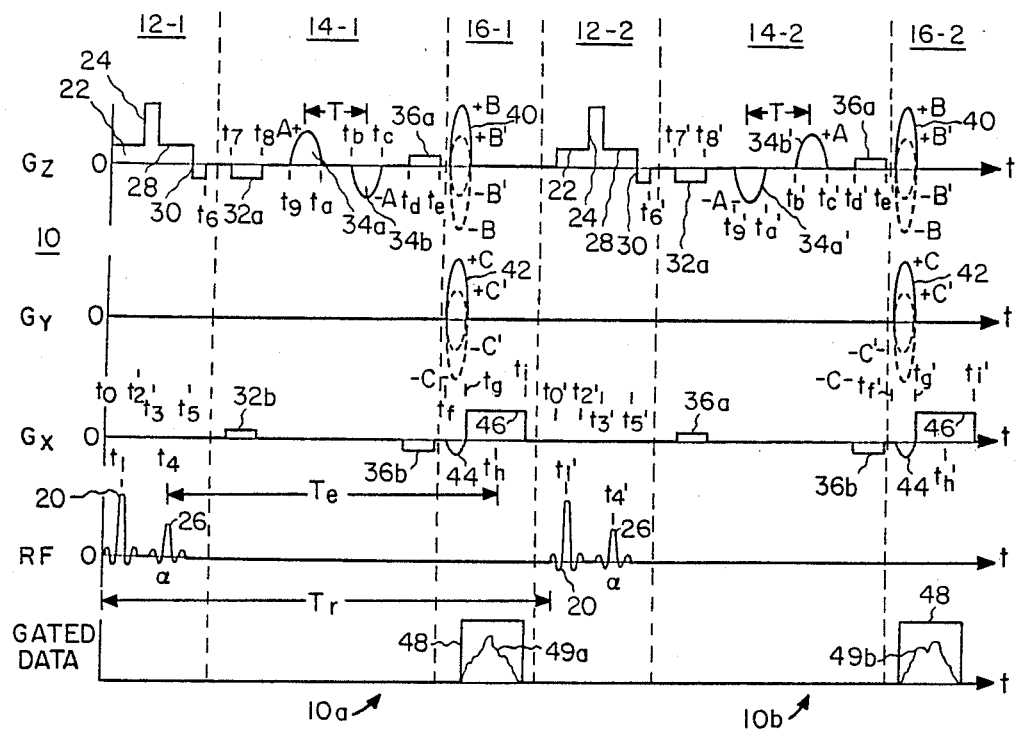
FIG. 1a is a set of time-coordinated graphs illustrating the magnetic field gradient, RF and data gate signals for a sequential pair of sequences of one presently preferred NEX=2 embodiment of the NMR method of the present invention.

The method of the present invention is practiced in a nuclear magnetic resonance (NMR) system in which a sample, e.g., a patient, is placed in an imaging region in which a highly homogeneous and relatively high-intensity static magnetic field $B_0$ is provided. As is well-known to the art, the static magnetic field $B_0$ is formed along a chosen volume axis, e.g., the z axis of a Cartesian coordinate system having its center within the bore of a magnet means providing the static field. Magnetic field gradient-forming means are used to form a set of substantially orthogonal magnetic field gradients impressed upon the static field. For the Cartesian coordinate system, the gradients $G_x$, $G_y$, and $G_z$ can be summarized as: $G_x = \partial B_0/\partial x$, $G_Y = \partial B_0/\partial y$, and $G_z = \partial B_0/\partial z$. In addition to the static magnetic field $B_0$ and the magnetic field gradients $G_x$, $G_y$ and $G_z$ therein, the sample is subject to a radio-frequency (RF) magnetic field $B_1$ rotating at the resonance, or Larmor, frequency $\omega = \gamma B_0$, where $\gamma$ is the gyromagnetic constant for the particular nuclear species to be imaged. The static magnetic field $B_0$, the agnetic field gradients $G_x$, $G_y$ and $G_z$ and the RF magnetic field $B_1$ are all provided by means, and in manner, well known to the art.

Prior to describing the various presently preferred embodiments of our novel NMR imaging method, a brief statement is presented of the applicable theory of imaging macroscopic spin motion by a monitoring of spin magnetization phase. The required information about transverse spin magnetization phase change is readily derived from a bimodal flow-encoding gradient pulse set, i.e. a pair of pulses having opposite polarity in each excitation sequence, and with polarity alternating in alternating ones of the sequences. The Larmor frequency ($\omega$), in the presence of a magnetic field gradient, is dependent upon the position of the spin providing the response signal; thus, $\omega(z) = \gamma(B_0 + z \cdot G_z)$ where $G_z$ is the magnetic field gradient strength in the desired direction, e.g. the Z direction. Responsive to an applied gradient pulse which starts at a time $t=0$ and ends at another time $t=T_g$, the transverse spin magnetization phase change $\phi$ is $$\Phi = \gamma \int_0^{T_g} Z(t) G_z(t) dt \qquad (1)$$

where $z(t)$ and $G_z(t)$ are the spin position and gradient field strength as respective time functions. Both moving and nonmoving excited spins will be subjected to the gradient field; only the moving excited spins have a non-constant spin position time function $z(t)$. If the excited spins experience constant motion in the direction of the applied field gradient, this spin position time function $z(t)$ is $z(t) = Z_0 - Vt$, where $Z_0$ is the spin position at time $t=0$ and $V$ is the spin velocity. Thus, $$\phi = \gamma \int_0^{T_g} Z_0 G_z(t) dt - \gamma \int_0^{T_g} Vt G_z(t) dt. \qquad (2)$$

When a second gradient pulse $G'_z(t)$ is applied to the sample at a time $T$ after the beginning of the first gradient pulse, the entire phase shift $\Phi$ introduced by the gradient magnetic field pulse pair is given as:

$$\phi = \gamma \int_0^{T_g} Z_0 G_z(t) dt - \gamma \int_0^{T_g} Vt G_z(t) dt + \\ \gamma \int_r^{(T+T'_g)} Z_1 G'_z(t) dt - \gamma \int_r^{(T+T'_g)} Vt G'_z(t) dt, \qquad (3)$$

where $Z_1$ is the position of the spin at the commencement of the second gradient pulse $G'_z(t)$. If the second gradient pulse is made identical in shape and amplitude to the shape and amplitude of the first gradient pulse, but is given opposite polarity, i.e. $G'_z(t) = -G_z(t)$ and $T'_g = T_g$, equation 3 reduces to $$\Phi = \gamma A_g (Z_0 - Z_1) \qquad (4)$$

where $A_g$ is the total area under each gradient pulse. Since the velocity of the spins is assumed to be constant, $Z_0 - Z_1 = VT$, and therefore, $\phi = \gamma A_g VT$, which provides the basis for selective detection of moving spin magnetization; it will be seen that the phase shift induced in the spin magnetization of stationary spins, having (by definition) a velocity $V=0$, by a bimodal pair of gradient pulses, is itself zero. Conversely, it will be seen that the phase shift induced by moving spin magnetization depends linearly on the spin velocity $V$, the interpulse delay time interval $T$ and the gradient pulse area ($A_g$). Therefore, data acquired for two different conditions of any of these three variables ($V$, $T$ or $A_g$) can be subtracted, one from the other, to leave a resultant containing only spin density information for moving spins. Likewise, addition of the data acquired for the two different conditions (preferably, by modulation of $A_g$) leaves a different resultant containing only spin density information for stationary spins. As discussed in the aforementioned U.S. Patent, while NMR angiography will work with one sequence of a pair being devoid of the bimodal gradient pulses, a better result is obtained if the polarity of the flow-encoding gradient pulses are inverted on alternate excitations; this form is used in the illustrative pulse sequences described herein.

From the foregoing brief theoretical exposition, it will be seen that the complex difference of two data sets, each acquired from a different one of two echoes (as described above) has a modulus which is a sinusoidal function of spin velocity. This presents the possibility of aliasing conditions wherein certain spin velocities will provide no observed signal, or will be indistinguishable from lower spin velocities. The aliasing problem can be obviated if the induced phase shift is constrained to be less than $\pi/2$ radians. In fact, if the induced phase shift $\phi$ is constrained to be less than one radian, the image intensity is approximately linear with respect to spin velocity. Since the measured signal intensity is also a linear function of the number of spins, image pixel intensity is proportional to volume (and therefore mass) flow, so that the total flow of blood within a vessel can be measured by integrating the signal intensity across the vessel. Only that flow component in the direction of the one applied flow-encoding gradient is imaged with such a pulse sequence. A total volume flow angiogram can be obtained by acquiring three separate angiograms, each sensitive in a flow direction orthogonal to one another, and combining these three individual angiograms using the relationship $I_t = (I_x^2 + I_y^2 + I_z^2)^{\frac{1}{2}}$, where $I_t$ is the total intensity and $I_x$, $I_y$ and $I_z$ are the intensities of the corresponding pixels in the three orthogonal angiograms. Finally, it should be realized that an angiogram can be generated by combining the flow-encoding gradient pulses with any standard imaging procedure. The imaging procedure utilized here is the gradient-refocussed volume spin-warp, but any other of the well-known procedures can be utilized.

Referring initially to FIG. 1a, one presently preferred embodiment of our method for simultaneously obtaining NMR three-dimensional angiograms and three-dimensional stationary tissue images, uses a procedure 10 utilizing a multiplicity of sequential pairs of sequences 10a and 10b to acquire NMR response data with one pair of phase-encoding gradient amplitudes of the plurality S of such amplitude pairs needed for a complete three-dimensional volume image, where the total pairs plurality $S=N_z\cdot N_y$, and $N_z$ is the number of the different Z-gradient values and $N_y$ is the number of the different Y-gradient values necessary for obtaining the volume image Each sequence of sequence pair 10a–10b commences with an excitation subsequence 12-1 or 12-2 respectively, followed by a flow-encoding subsequence 14-1 or 14-2, respectively, and ending with an imaging subsequence 16-1 or 16-2, respectively. In each excitation subsequence 12 saturation is optionally induced with a large-amplitude RF pulse 20 (commencing at time $t_0$ or time $t_{0'}$, peaking at a midtime $t_1$ or $t_{1'}$ and ending at a time $t_2$ or $t_{2'}$) and a companion magnetic field gradient (here, a $G_z$ gradient portion 22) of amplitude selected to limit the volume of a slab (on either side of the slab to be imaged) in which longitudinal magnetization is reduced substantially to zero. A spoiler pulse 24 is optionally introduced in the same gradient magnetic field in the same direction (here, the Z direction) to dephase any transverse magnetization to zero and destroy any coherence left after the saturation pulse 20/22 combination. While both saturation and spoiler pulses are optional, use of a spoiler pulse after a saturation pulse is highly preferable. The magnetization of the nuclear species selected for imaging is then nutated by a flip angle $\alpha$, responsive to a RF signal pulse 26, along with a slice-selective gradient 28 applied to limit the field of excitation. The nutation pulse 26 starts at a time $t_3/t_{3'}$, peaks at a midtime $t_4/t_{4'}$ and ends, along with the cessation with the slice-selective gradient 28, at a time $t_5/t_{5'}$. The phase of the RF pulses 20 and 26 are kept constant. We presently prefer the RF signal pulse 26 to nutate, or "flip", the spin magnetization vector to an angle $\alpha$ between about 15° and about 30°, although lesser or greater flip angles can be utilized. Thereafter, a rephasing pulse 30 can be provided, if desired, from time $t_5/t_{5'}$ to time $t_6/t_{6'}$, with an amplitude such that the total area under the rephasing pulse lobe 30 is substantially equal to one half the total area of slice-selective gradient pulse lobe 28. It should be understood that the excitation subsequence 12 can also be utilized without the saturation portion 20/22 and/or the spoiler portion 24 and can be utilized without the slice-selective gradient field lobe 28, if desired.

The nutated spins are then flow-encoded during each subsequence 14. A bipolar pair of flow-encoding pulses 34a and 34b, of opposite polarity, are utilized. In the first sequence 10a, the first flow-encoding gradient pulse 34a commences at time $t_9$, rises to the maximum positive amplitude $+A$ and returns to a substantially zero amplitude at pulse termination time $t_a$, so as to have an area $A_g$. Shortly thereafter, the opposite-polarity second flow-encoding gradient pulse 34b commences at time $t_b$, falls to a maximum negative value $-A$ and then returns to a substantially zero amplitude at pulse termination time $t_c$, and also has an area $A_g$. Advantageously, the pulse time intervals are essentially equal and the pulses have a time interval T between the effective centers of their temporal areas. Each lobe of the bipolar pulse induces a phase shift in all nutated spins of the sample, which phase shift is essentially negated, for stationary spins, by an oppositely polarized pair of flow-encoding pulses 34a' and 34b' of the second sequence 10b of each pair. Thus, it will be seen that the first pulse 34a' (from time $t_{9'}$ to time $t_{a'}$) of the second pair is of negative polarity, while the second pulse 34b' (from time $t_{b'}$ to time $t_i$) is of positive polarity, and both are of area $A_g$; thus, the amplitude of the flow-encoding pulses are modulated in each successive sequence. If desired, a pair of oppositely polarized flow-compensation lobes 32a and 32b, respectively present in the time interval between time $t_7/t_{7'}$ and time $T_8/t_{8'}$ and the time interval from time $t_d/t_{d'}$ to time $t_e/t_{e'}$ can be utilized in each sequence to compensate the flow for the effects of the $G_z$ slice-selection gradient lobes 28 and/or 30.

After the spins of the nuclei in the excited volume have been flow-encoded, information about the tagged spins is acquired in each imaging subsequence 16 following the respective flow-encoding subsequence 14. Here, a three-dimensional gradient-refocus spin warp imaging subsequence is utilized. Commencing at time $t_f/t_{f'}$, a first phase-encoding gradient lobe 40 is provided in a first selective gradient direction (here, the Z direction gradient $G_z$) which was the flow-encoding direction, and, simultaneously, a second phase-encoding gradient lobe 42 is provided in a second selective gradient direction, (here, the Y direction gradient $G_Y$), both orthogonal to a selected readout direction (here, the X direction). The Z and Y gradient lobes 40 and 42 have the same pair of magnitudes in each of the two sequences 10a and 10b of a sequence pair, with one of the gradient values changing in the next pair of sequences, in manner well known to the art. Simultaneous with the phase-encoding lobes 40 and 42, a readout signal dephasing pulse portion 44 precedes the actual readout gradient signal 46, which, starts at time $t_g/t_{g'}$ and ends at time $t_i/t_{i'}$, with the readout time interval temporal midpoint time $t_h/t_{h'}$ being the time at which the center of the echo occurs, marking the end of the echo time interval $T_e$ (which commenced at the midtime $t_4/t_{4'}$ of RF nutation pulse 26). The NMR system has a receiver in which a data gate waveform 48 is utilized to determine the time (from time $t_g/t_{g'}$ to time $t_i/t_{i'}$) during which the resulting NMR response signal 49a is received, digitized and processed, in known NMR imaging manner.

Figure 3:
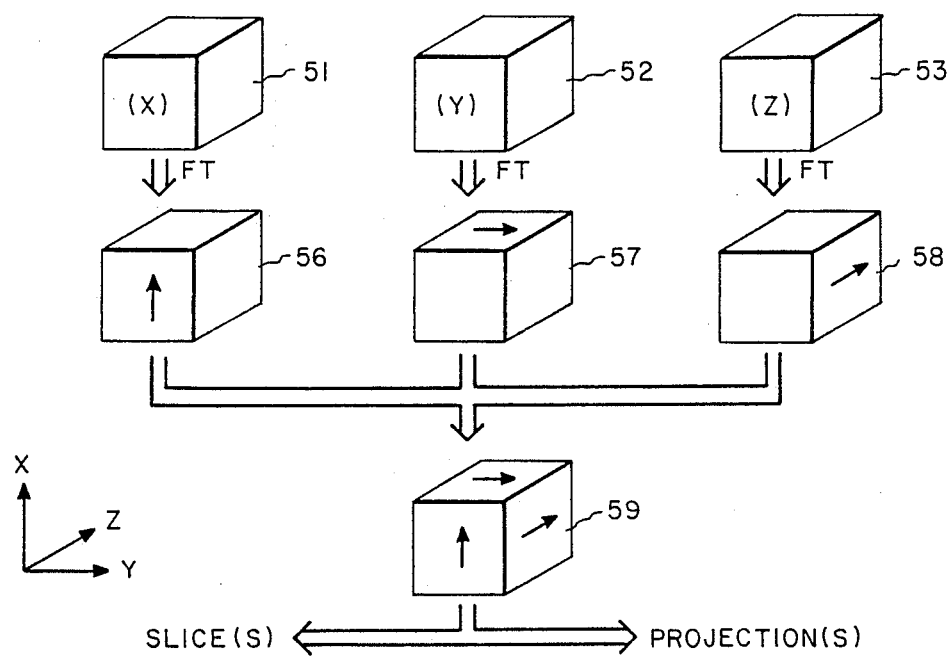
FIG. 3 is a schematic illustration of the manner in which the flow-encoded information, in each of three orthogonal directions, is combined into a volumetric flow-encoded set.

In the second sequence 10b of each sequence pair, all of the waveforms have exactly the same amplitude and timing values as in first sequence 10a, except for the modulation (e.g. inversion of the polarity) of the flow-encoding pulses. Illustratively, first flow-encoding pulse 34a' now has a negative polarity and second flow-encoding pulse 34b' has a positive polarity. It will be seen that the second sequence response signal 49b is processed in the same manner as the first sequence response signal 49a. The resulting second data set, obtained from response signal 49b, is subtracted from the first data set obtained from response signal 49a, to provide a difference data set; added to the first data set obtained from response signal 49a, to provide a summation data set; and is operated upon, with the first response signal 49a data set, to derive phase information indicative of flow in the direction of the flow-encoding pulse, here the Z-direction. The plurality S of sequences 10 are repeated both a second time with flow-encoding pulses in another direction (e.g., in the Y-direction), and a third time with flow-encoding pulses in the remaining direction (e.g. the X direction), each preferably with the same readout direction (e.g. the X direction) to provide three total data sets, each containing information as to the amplitude and phase of moving spin vectors in the entire three-dimensional volume being examined, as well as information as to the amplitude of stationary spins in the same volume. This is indicated in FIG. 3, where 3D data sets 51,52 and 53, responsive respectively to flow-encoding in the X,Y and Z directions, are each individually 3D-Fourier transformed into respective X,Y and Z responsive flow vector sets 56, 57 and 58 and then combined into a 3D flow vector set 59, which can be entered to obtain 2D slice(s) or projection(s) of the 3D volume data.

Referring now to FIG. 2a the process for obtaining three-dimensional volume data with two (NEX=2) excitations; for each (Y-Z) strip in a sample volume, involves first setting up the initial conditions, in step A, including, but not limited to, the volume limitations, the desired flip angle, the readout direction and so forth. Step B is entered and the phases for the (Y and Z) gradients to properly phase-encode the next strip, are updated. Thereafter, step C is entered, one of sequences 10a run and an NMR response, or echo, is actually acquired and the data thereof digitized and stored. Then step D is entered and the flow-encoding lobe polarities are inverted. The process now enters decision step E and determines whether or not a second pass at the present phase-encoding values has been made; if not, the program loops back to step C to acquire echo data for a sequence 10b with the inverted-polarity flow-encoding pulses, before again inverting the flow-encoding pulse polarity in a second pass through step D. When step E is now reentered, or if the first entry into step E indicates that the second pass has been completed, step F is entered and the present phase-encoding values are compared with the final (Y and Z) phases required for the selected volume. If the prepulses sent pair of phases is not the final phase pair, step F is exited to step B, wherein the phase pair is updated and the entire sequence repeated until step F can be entered and the present phase-encoding pair is equated to the last phase pair for the volume to be investigated. In that case, step F is satisfied and the procedure excites into step G and stops, as all data has been acquired. Now, the difference and summation of each sequential pair of data sets is taken, i.e. the first and second pass data sets are operated upon, then the third and fourth data sets are operated upon, until the (2N−1)-th and (2N)-th data sets, where N is the number of sequence pairs 10 utilized, are operated upon.

Figure 1B:
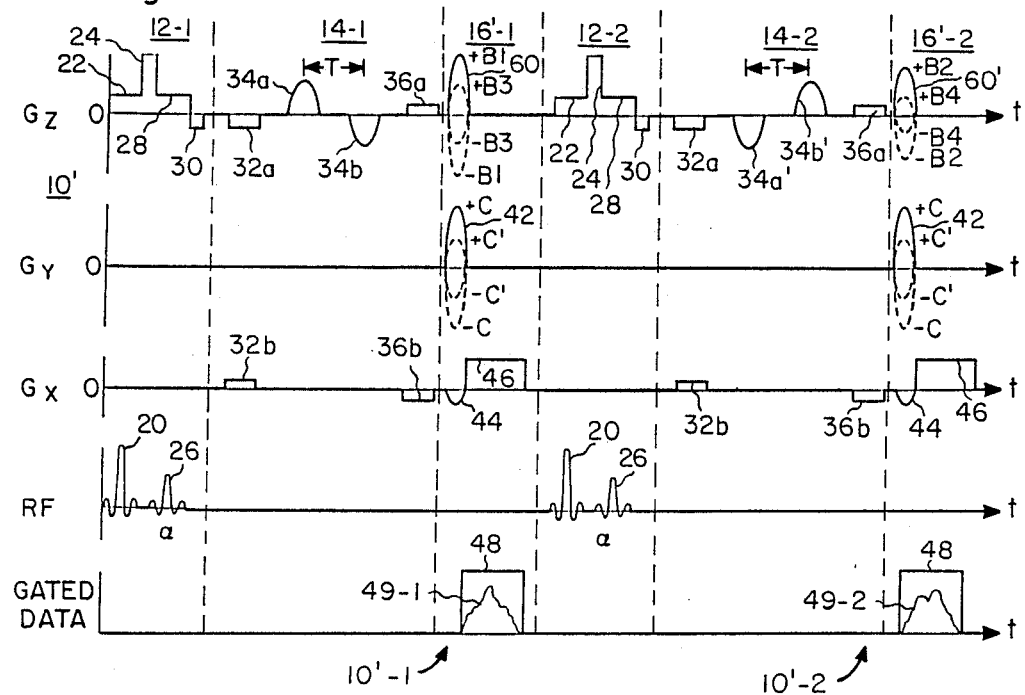
FIG. 1b is a set of time-coordinated graphs illustrating magnetic field gradient, RF and data gate signals for two sequential sequences of a presently preferred NEX=1 embodiment of the present method.

Referring now to FIGS. 1b and 2b, a preferred method for NEX=1, which does not require deriving difference data sets, uses a procedure 10' wherein each separate single sequence (rather than each sequence pair) gives a modulated, but separate, K-space data term. The entire procedure 10' is made up of the plurality S of sequences 10'-1, 10'-2, ... , 10'-s, ... , where $1 \leq s \leq S$ and $S = M_y \cdot M_z$ is the total number of Y-Z strips in the volume to be imaged. Thus, each sequence 10'-s has a unique pair of values of the Y-gradient lobe 42 magnitude and a Z-gradient lobe 60 magnitude. That is, with two exceptions, each of sequences 10'-i is identical to any other one of sequences 10'-i and to either of the sequences 10a/10b of FIG. 1a the exceptions are: (1) the use of either modulated flow-encoding gradient lobes 34a/34b or lobes 34a'/34b' (which are modulated by having the polarity thereof inverted in each successive sequence); and (2) the use of a unique pair of phase-encoding lobe 42/60 values. In contradistinction note the use of twice as many (a pair of) sequences 10a/10b in the procedure 10 of FIG. 1a, wherein the same pair of Y-Z lobe values is used in both sequences of the pair. Thus, in a first sequence 10'-1 the Y gradient lobe 42 is at a first value (e.g. maximum value +C) and the Z gradient lobe 60 is at a first value thereof (e.g. maximum value +B1). After obtaining response data from response signal 49-1, the second sequence 10'-2 commences and, along with an inversion of the flow-encoding gradients, the next pair of Y-Z imaging gradients is utilized; here, assume that the Y phase-encoding gradient lobe 42 is still at its first (+C) value, but the Z phase-encoding gradient 60' is now at a second value +B2, less than value +B1. The response data 49-2 is received, digitized and stored, in second sequence 10'-2. A third sequence, identical to sequence 10'-1 except for the phase-encoding lobe 42/60 values, has the flow-encoding pulses again being inverted (to now have a positive polarity pulse 34a before a negative-polarity 34b) but now with a third Y-Z combination; this may be the same maximum Y gradient (+C) value but with a net-lower Z gradient amplitude (+B3) for lobe 60. A fourth sequence repeats sequence 10'-2 (inverted flow encoding lobes 34a'/34b') and a next pair of Y/Z lobe 42/60 values (say, +C and +B4<+B3). Thereafter, the sequences continue, with modulation of the flow-encoding lobes 34, and sequential change (e.g. diminution) of the Z-direction phase-encoding magnitude, until all of the Z values have been utilized. Note that, with the exception of changing phase-encoding lobe pair values, all oddnumbered sequences are identical to sequence 10'-1 and all even-numbered sequences are identical to sequence 10'-2. Thus, the overall master sequence 10' continues with the sequences going through all of the Z values, again, for the Z-axis lobe 60 and with the next-largest Y gradient value (e.g. next-largest positive gradient +C') for lobe 42. The process continues, with all of the Z gradient values being repeated for each of the successively smaller +Y gradient values, the zero Y-gradient value (if used), and all of the successively-greater-amplitude, negative-polarity Y gradient values, until the entire Y and Z set has been completely utilized. For each sequence, the digitized data can contribute to a difference set, a sum set and a phase set, from which the unified data matrix, occupied partly by the moving spins and partly by the stationary spins, is derived. Advantageously, slice-selective gradient 28 is applied to limit the field of excitation preferably to less than one-half the field-of-view in the associated phase-encoding (Z) direction in the imaging subsequences (this being helpful in keeping image information from stationary spins at the center of the 3D data matrix, while moving-spin signal information is moved to the edge of the matrix).

Recapitulating, and referring particularly to FIG. 2b, after the initial conditions are set up in step A', the phase-encoding information is updated to the first phase-encoding readout pair (e.g. the maximum Y gradient value +C and the first, or maximum, Z gradient value +B1), in step B'. The first sequence 10'-1 is run in step C', to acquire the first echo data. Step D' is entered to invert the flow-encoding polarity, to the proper polarity (negative polarity first) for the second sequence 10'-2. Decision step F' is entered and the present phase combination is checked against the final Y-Z phase pair. Since this final phase pair (largest negative-polarity Y-gradient $-C$ value and largest negative-polarity Z-gradient $-B1$ value) has not been reached, step F' exits to step B', wherein the phase-encoding information is updated (by setting only the Z gradient value to its next amplitude, e.g. $+B2$). A new (second) echo is acquired as step C' is traversed, and step D' is again entered, to re-invert the flow-encoding pulse polarities preparatory to the next odd-numbered sequence (duplicative of sequence 10'-1, but with a different set of Y-Z lobe 42/60 values). This action, of inversion of the flow-encoding gradient lobes and a pair of Y-Z phase-encoding lobe 42/60 values for each sequence, continues until step F' is entered after the last Y-Z pair of phase-encoding values is used. Then, step F' decides YES and the procedure enters step G' and ends. This sequence is repeated twice, with Y-axis flow-encoding (for step 52) and with X-axis flow-encoding (for step 51), to obtain the full 3-D flow-encoded data set, from which moving spin flow-vectors and stationary spin amplitude are obtained (step 59).

In accordance with another presently preferred method, shown in FIG. 2c, we start with set-up step A", wherein we set: duration, amplitude and phase of magnetization-destroying pulses 20/22/24; extent of field-of-view in the readout (e.g. X) and both phase-encoding (e.g. Y and Z) directions; flip angle $\alpha$ for RF pulse 26; amplitude for gradient lobe(s) 28 and 30 (if used) to set the excited volume to be less than half the field-of-view; parameters of the pair of flow-encoding lobes 34 (which is set, initially, to the negative-polarity-lobe-first condition); and similar initial conditions. The sequence enters step B"-1 and the phase-encoding (Z) direction lobe 60 value is updated to the first value (e.g. to maximum $+B1$). Then, step D" is entered and the flow-encoding gradient lobe polarities are inverted (the first lobe is now positive and the second lobe is now negative). The second phase-encoding (Y) direction lobe 42 value is updated (e.g. to maximum $+C$ for the sequence) in step B"-2. Now, we enter step C" and run the first sequence 10-1, acquiring a first response data set. We separately check for last Y phase (step F"-1) and last Z phase (step F"-2); since in this method, the range of Y values is traversed completely for each individual Z value, due to the inner loop consisting of steps B"-2/F"-1, before the next Z value is updated in the outer B"-1/F"-2 loop. Thus, after the first sequence 10'-1 is run, decision step F"-1 is entered and, as the last Y phase has not been used, a NO answer directs the procedure to step B"-2, wherein the Y-direction phase is updated to its second value (e.g. $+C'$) and a second set of echo data is acquired in step C". Step F"-1 is reentered and the Y-direction phase value is updated (to a zero value) and a third echo data set is taken. Thereafter, the rest of the Y phase encoding values (here, a $-C'$ value and then a $-C$ value) are individually encoded and data taken, while the Z phase-encoding value remains at the maximum $+B1$ value. Now, step F"-1 is entered and, the last Y phase value having been used, step F"-2 is entered and the next Z-direction phase value ($+B2$) is entered and the entire sequence of activity rerun. Only after all of the Y phaseencoding values have been run for each of the different Z phase-encoding values is the final step G" entered and the procedure ended. It should be noted that this procedure works equally as well with the flow-encoding polarity-inverting step D" placed after the second-direction phaseencoding (Y) update step B"-2 and immediately prior to the echo data acquisition step C". As in the other methods, the procedure is run a second and third time, with the flow-encoding direction being changed from the Z direction (step 53) successively to the X and Y directions (steps 51 and 52, in either order). This assures that, upon individual Fourier transformation of the entire three-dimensional data set obtained for each flow-encoding direction, the X, Y, and Z flow-direction data sets 56, 57 and 58 are obtained, for construction of the desired three-dimensional flow vector/stationary spins data set 59, from which slice and/or projection information can be obtained.

Figure 4A:
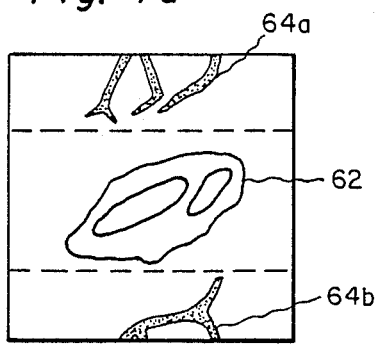
FIG. 4a is a pictorial representation of a two-dimensional image of a plane selected from the resulting K-space volume data matrix.
Figure 4B:
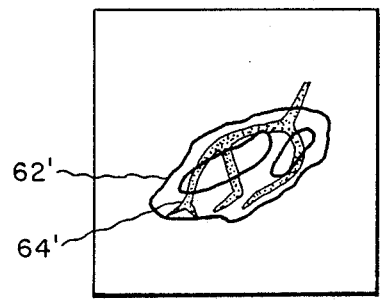
FIG. 4b is a graphic representation of the image obtained by manipulation of the data matrix to provide simultaneous overlapping flowing fluid and stationary tissue images.

When the data is acquired with respect to the procedure of FIG. 2c, after Fourier-transformation the reconstructed image information from the stationary tissue remains in the center of the three-dimensional data matrix, while the signal information for moving spins appears at the matrix edge. The data matrix can thus be directly presented as the image of FIG. 4a, wherein a stationary tissue image portion 62 is in the center of the resulting image and a first half 64a of a moving-spins image is spaced towards one edge thereof, with the other half 64b of the moving-spins image being spaced towards the opposite edge. The data matrix can be manipulated, e.g. "rolled", to yield a data set in which the three-dimensional stationary image 62', as shown in FIG. 4b, is in the first half of the three dimensional data matrix and the three-dimensional flow image 64' is in the other half of the data matrix. By proper rolling and movement, the two images can be merged, to provide a complete picture of stationary and moving spins within the selected sample volume. It will be seen that, by proper choice of color, intensity and the like graphic characteristics (for example, stationary tissue having various gray-scale intensities, blood flow in a first direction being a first color, such as red, and in another direction being a different color, such as blue) a series of two-dimensional slices, or projections, of the entire three-dimensional volume can be presented, showing stationary and flowing spins in a manner highly beneficial to medical diagnosis and the like uses.

Our novel method for simultaneously obtaining three-dimensional NMR angiograms and stationary tissue NMR images, and especially the method utilizing NEX=1, not only does not need any form of projection-dephasing gradient to limit dynamic range, but also overcomes the problem with voxels which are defined only in two dimensions (i.e. having a great depth in a third dimension) so that any phase variation over the range of that relatively-uncontrolled depth presents a problem, whereas, in contradistinction, voxels fully defined in all three dimensions have a small depth and relatively no phase dispersion, so that the depth-phase problem does not appear.

While several presently preferred embodiments of our novel invention is described in detail herein, many modifications and variations will now become apparent to those skilled in the art. It is our intent, therefore, to be limited only by the scope of the appending claims, and not by the particular details and instrumentalities presented by way of explanation of the embodiments, described herein.

What we claim is:

1. A method for simultaneously obtaining a three dimensional (3D) nulcear magnetic resonance (NMR)

image of moving spins in a region of a sample, and a 3D NMR image of stationary spins in the same sample region, comprising the steps of:

(a) immersing the sample in a main static magnetic field;

(b) nutating, in an excitation subsequence of each of a plurality S of successive NEX=1 NMR sequences, the spins of all nuclei of a selected species;

(c) generating, in a flow-encoding subsequence after each nutation, at least one modulated flow-encoding signal pulse in a first magnetic field gradient impressed upon the sample in a first direction selected to cause a resulting NMR response echo signal from the spin of a nucleus moving in the first direction to be different from the NMR response echo signal from the spin of a substantially stationary nucleus;

(d) then, in a subsequent imaging subsequence, acquiring responsive to a readout magnetic field gradient impressed upon the sample in a second direction, independent of the first direction, a set of data from the NMR response signal evoked, from at least the sample portion, with each of the plurality S of combinations of phase-encoding amplitudes operating upon the selected sample portion in the remaining two independent directions of a 3D Cartesian coordinate system;

(e) processing the data in each of the acquired NMR response signal data sets to generate at least one of
 (1) a difference data set from which response data obtained from stationary nuclei has been substantially removed,
 (2) a summation data set from which response data obtained from moving nuclei has been substantially removed, and
 (3) a phase data set indicating direction of flow for flow amplitudes obtained in the difference data set; and (f) generating, responsive to the plurality of data sets, both an image of moving spins, projected in a selected plane in a 3D volume, and an image of stationary spins in the same plane.

2. The method of claim 1, wherein step (c) further includes the step of modulating a pair of flow-encoding pulses in alternating ones of the sequences to have each of the flow-encoding pulses of a polarity opposite to the polarity of the like-positioned flow-encoding pulse in the previous sequence.

3. The method of claim 1, wherein step (b) further includes the step of applying a slice-selective magnetic field gradient during each nutation.

4. The method of claim 3,, wherein step (b) further includes the step of applying a rephasing magnetic field gradient immediately after termination of each slice-selective gradient.

5. The method of claim 3, wherein step (b) further includes the step of providing a spoiler signal pulse in a magnetic field gradient in a selected direction, prior to nutation.

6. The method of claim 3, wherein step (b) further includes the step of providing a saturation signal to substantially limit transverse magnetization in a selected direction, prior to nutation.

7. The method of claim 6, wherein step (b) further includes the step of providing, after the saturation signal and prior to nutation, a spoiler signal pulse in the magnetic field gradient in that same direction.

8. The method of claim 3, wherein step (c) includes the step of applying at least one flow-compensation signal in the first magnetic field gradient.

9. The method of claim 1, further comprising the steps of:

(g) repeating steps (b)–(e) for flow-encoding signals in magnetic field gradients in each of second and third directions, substantially mutually orthogonal to the first direction and to each other, to obtain respective second and third ones of the selected data set categories in step (e); and (h) processing the three data sets in each of the selected categories to obtain a 3D data set of at least the vector flow of moving spins in the sample region.

10. The method of claim 1, wherein step (f) includes the step of processing the data to cause the stationary image and the moving-spins image to be viewable as substantially superimposed images.

11. A method for simultaneously obtaining a three dimensional (3D) nuclear magnetic resonance (NMR) image of moving spins in a region of a sample, and a 3D NMR image of stationary spins in the same sample region, comprising the steps of:

(a) immersing the sample in a main static magnetic field;

(b) nutating, in an excitation subsequence of each of a plurality S of successive NEX=2 pairs of NMR sequences, the spins of all nuclei of a selected species;

(c) generating, in a flow-encoding subsequence after each nutation, at least one modulated flow-encoding signal pulse in a first magnetic field gradient impressed upon the sample, in a first direction selected to cause a resulting NMR response echo signal from the spin of a nucleus moving in the first direction to be different from the NMR response echo signal from the spin of a substantially stationary nucleus, and modulating the flow-encoding pulses in alternating ones of the sequences to have each of the flow-encoding pulses of a polarity opposite to the polarity of the like-positioned flow-encoding pulse in the previous sequence;

(d) theh, in a subsequent imaging subsequence, acquiring responsive to a readout magnetic field gradient imposed upon the sample in a second direction, independent of the first direction, a set of data from the NMR response signal evoked, from at least the sample portion, with each of the plurality S of combinations of phase-encoding amplitudes operating upon the selected sample portion in the remaining two independent directions of a 3D Cartesian coordinate system, in each successive pair of sequences;

(e) processing the data in each successive pair of the acquired NMR response signal data sets to generate at least one of
 (1) a difference data set from which response data obtained from stationary nuclei has been substantially removed,
 (2) a summation data set from which response data obtained from moving nuclei has been substantially removed, and
 (3) a phase data set indicating direction of flow for flow amplitudes obtained in the difference data set; and (f) generating, responsive to the plurality of data sets, both an image of moving spins, projected in a selected plane in a 3D volume, and an image of stationary spins in the same plane.

12. The method of claim 11, wherein step (b) further includes the step of applying a slice-selective magnetic field gradient during each nutation.

13. The method of claim 12, wherein step (b) further includes the step of applying a rephasing magnetic field gradient immediately after termination of each slice-selective gradient.

14. The method of claim 12, wherein step (c) includes the step of applying at least one flow-compensation signal in the first magnetic field gradient.

15. The method of claim 11, further comprising the steps of:

(g) repeating steps (b)–(e) for flow-encoding signals in magnetic gradients in each of second and third directions, substantially mutually orthogonal to the first direction and to each other, to obtain respective second and third ones of the selected data set categories in step (e); and (h) processing the three data sets in each of the selected categories to obtain a 3D data set of at least the vector flow of moving spins in the sample region.

16. The method of claim 15, wherein step (f) includes the step of processing the data to cause the stationary image and the moving-spins image to be viewable as substantially superimposed images.

* * * * *